United States Patent [19]

Starkweather, Sr.

[11] Patent Number: 5,402,719

[45] Date of Patent: Apr. 4, 1995

[54] SILK SCREEN WORK STATIONS AND CLAMP MECHANISM ASSEMBLIES FOR THE PRECISE POSITIONING AND SUPPORT OF THE WORK PIECES

[76] Inventor: Ronald A. Starkweather, Sr., 152 Charter Oak St., Manchester, Conn. 06040

[21] Appl. No.: 188,689

[22] Filed: Jan. 31, 1994

[51] Int. Cl.6 .............................................. B41F 15/16
[52] U.S. Cl. .................... 101/126; 101/114; 101/474; 101/DIG. 36; 248/913
[58] Field of Search ...................... 101/114, 126, 127.1, 101/128, 128.1, 129, 474, DIG. 36; 33/614, 617, 620; 248/913; 312/140.3, 140.4; 269/73

[56] References Cited

U.S. PATENT DOCUMENTS

| | | | |
|---|---|---|---|
| 3,492,942 | 2/1970 | Forslund | 101/126 |
| 3,788,215 | 1/1974 | Lambert | 101/126 |
| 5,048,417 | 9/1991 | Everroad | 101/126 |
| 5,092,193 | 3/1992 | Yanagisawa | 248/913 |

FOREIGN PATENT DOCUMENTS

| | | | |
|---|---|---|---|
| 1093393 | 5/1955 | France | 101/128.1 |
| 530345 | 7/1955 | Italy | 101/126 |
| 2019319 | 10/1979 | United Kingdom | 101/127.1 |

OTHER PUBLICATIONS

The Acromite Screen Printer, American Screen Process Equipment Company, Chicago, Ill. Dec. 1971.

*Primary Examiner*—Edgar S. Burr
*Assistant Examiner*—Stephen R. Funk

[57] ABSTRACT

A silk screen work station and clamp mechanism assembly for the precise positioning and support of a work piece comprising a cabinet which has an upper planar work surface with a centrally disposed working area and a pair of compartments below the work area and with cabinet drawers and storage space. The central working area also has a rectangular opening formed therein. The opening has lateral and longitudinal edges. A work plate in a rectangular configuration corresponds to the rectangular opening in the work surface, but slightly smaller lengthwise and width-wise for precise positioning within the opening during operation and use. A pair of spaced parallel lead screws are secured to the under side of the work surface on opposite sides of the opening through bearing members. The bearing members are secured to the under side of the work surface. A single lead screw extends transversely with respect to the pair of lead screws and is secured by bearing members to the under side of the work surface adjacent to the opening. A pair of threaded bearing members are secured to the under surface of the work plate. Each is threadably secured to one of the longitudinal lead screws for movement thereof and the work plate in the longitudinal direction. A pair of threaded bearing members are secured to the under surface of the work plate and threadedly secured along the transverse lead screw at spaced locations for the transverse movement of the work plate.

4 Claims, 4 Drawing Sheets

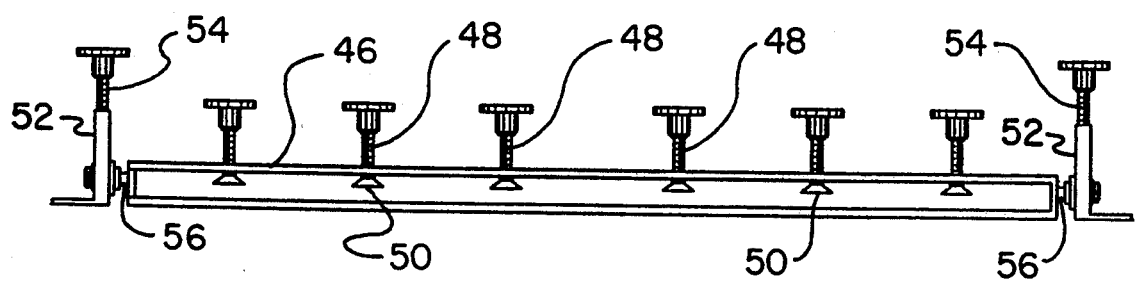
FIG. 7
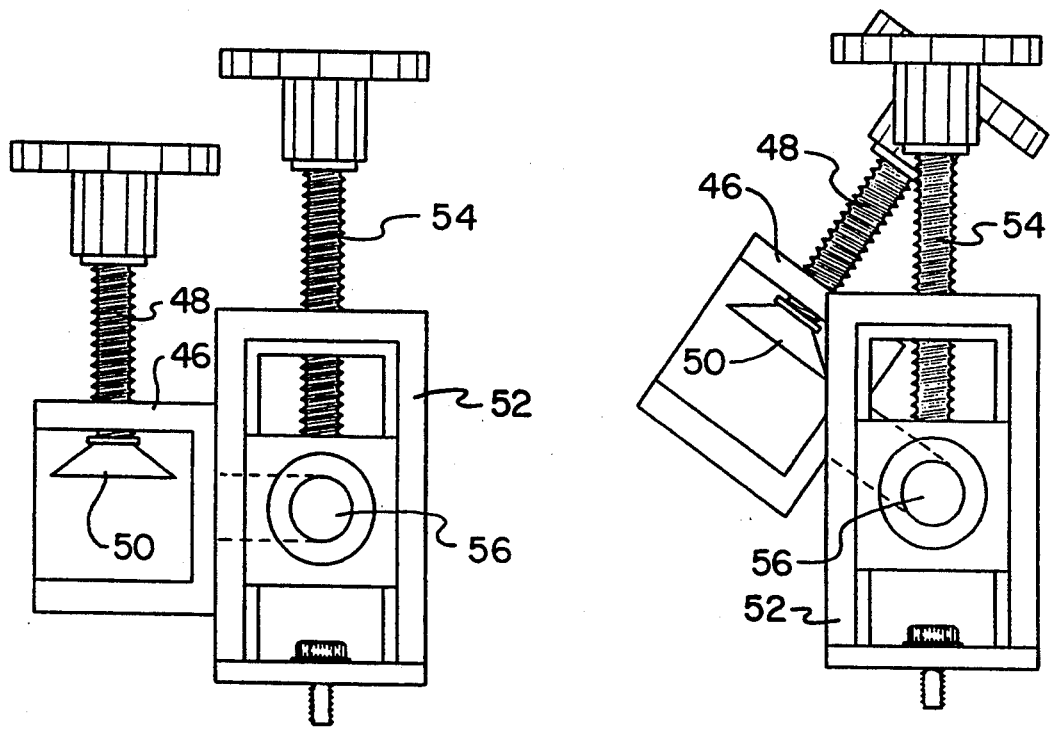
FIG. 8
FIG. 9

SILK SCREEN WORK STATIONS AND CLAMP MECHANISM ASSEMBLIES FOR THE PRECISE POSITIONING AND SUPPORT OF THE WORK PIECES

BACKGROUND OF THE INVENTION

1. Field of the Invention

The present invention relates to silk screen work stations and clamp mechanism assemblies for the precise positioning and support of the work pieces and more particularly pertains to supporting and positioning silk screen work pieces more precisely.

2. Description of the Prior Art

The use of silk screen devices is known in the prior art. More specifically, silk screen devices heretofore devised and utilized for the purpose of supporting and positioning silk screen work pieces are known to consist basically of familiar, expected, and obvious structural configurations, notwithstanding the myriad of designs encompassed by the crowded prior art which has been developed for the fulfillment of countless objectives and requirements.

By way of example, U.S. Pat. No. 3,458,165 to Hughes discloses a silk screen frame.

U.S. Pat. No. 3,543,679 to Wahl discloses a silk screen apparatus for printed circuit boards.

U.S. Pat. No. 4,520,726 to Rouly discloses a flat silk screen printing machine with movable pivoted support.

U.S. Pat. No. 4,520,727 to Miller discloses a method and apparatus for silk screen printing.

Lastly, U.S. Pat. No. 5,117,751 to Thompson discloses a clamping apparatus and method for positioning a printing screen over a screen table.

In this respect, the silk screen work stations and clamp mechanism assemblies for the precise positioning and support of the work pieces according to the present invention substantially departs from the conventional concepts and designs of the prior art, and in doing so provides an apparatus primarily developed for the purpose of supporting and positioning silk screen work pieces more precisely.

Therefore, it can be appreciated that there exists a continuing need for new and improved silk screen work stations and clamp mechanism assemblies for the precise positioning and support of the work pieces which can be used for supporting and positioning silk screen work pieces. In this regard, the present invention substantially fulfills this need.

SUMMARY OF THE INVENTION

In view of the foregoing disadvantages inherent in the known types of silk screen devices now present in the prior art, the present invention provides improved silk screen work stations and clamp mechanism assemblies for the precise positioning and support of the work pieces. As such, the general purpose of the present invention, which will be described subsequently in greater detail, is to provide new and improved silk screen work stations and clamp mechanism assemblies for the precise positioning and support of the work pieces which has all the advantages of the prior art and none of the disadvantages.

To attain this, the present invention essentially comprises a new and improved silk screen work station and clamp mechanism assembly for the precise positioning and support of a work piece comprising, in combination, a cabinet having an upper planar work surface with a centrally disposed working area and a pair of compartments below the work area and with cabinet drawers and storage space, the central working area also having a rectangular opening formed therein, the opening having lateral and longitudinal edges, a work plate in a rectangular configuration corresponding to the rectangular opening in the work surface, but slightly smaller lengthwise and width-wise for precise positioning within the opening during operation and use, a pair of spaced parallel lead screws secured to the under side of the work surface on opposite sides of the opening through bearing members, the bearing members being secured to the under side of the work surface, a single lead screw extending transversely with respect to the pair of lead screws and secured by bearing members to the under side of the work surface adjacent to the opening, a pair of threaded bearing members secured to the under surface of the work plate, each threadably secured to one of the longitudinal lead screws for movement thereof and the work plate in the longitudinal direction, a pair of threaded bearing members secured to the under surface of the work plate and threadedly secured along the transverse lead screw at spaced locations for the transverse movement of the work plate, a pair of lateral springs spaced from each other beneath the work surface and the work plate secured at their opposite ends to the work surface and work plate for resiliently biasing the work plate toward one lateral edge of the work surface, a pair of longitudinal springs spaced from each other and secured at one end to the under surface of the work plate and at the other end to the work surface for biasing the work plate to an adjacent longitudinal edge thereof and a support bar with a plurality of threaded apertures located across the upper edge of the work surface, with a plurality of threaded bolts with suction cups at their lower ends for releasable securement to the screen frame, and a pair of brackets at opposite ends of the support bar for effecting pivotable movement of the support bar, the supported threaded screws and the suction cups.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore an object of the present invention to provide new and improved silk screen work stations and clamp mechanism assemblies for the precise positioning and support of the work pieces which have all the advantages of the prior art silk screen devices and none of the disadvantages.

It is another object of the present invention to provide new and improved silk screen work stations and clamp mechanism assemblies for the precise positioning and support of the work pieces which may be easily and efficiently manufactured and marketed.

It is a further object of the present invention to provide new and improved silk screen work stations and clamp mechanism assemblies for the precise positioning and support of the work pieces which are of durable and reliable constructions.

An even further object of the present invention is to provide new and improved silk screen work stations and clamp mechanism assemblies for the precise positioning and support of the work pieces which are susceptible of a low cost of manufacture with regard to both materials and labor, and which accordingly are then susceptible of low prices of sale to the consuming public, thereby making such silk screen work stations and clamp mechanism assemblies for the precise positioning and support of the work pieces economically available to the buying public.

Still yet another object of the present invention is to provide new and improved silk screen work stations and clamp mechanism assemblies for the precise positioning and support of the work pieces which provide in the apparatuses and methods of the prior art some of the advantages thereof, while simultaneously overcoming some of the disadvantages normally associated therewith.

Still another object of the present invention is to support and position silk screen work pieces accurately.

Lastly, it is an object of the present invention to provide a new and improved silk screen work station and clamp mechanism assembly for the precise positioning and support of a work piece comprising a cabinet which has an upper planar work surface with a centrally disposed working area and a pair of compartments below the work area and with cabinet drawers and storage space. The central working area also has a rectangular opening formed therein. The opening has lateral and longitudinal edges. A work plate in a rectangular configuration corresponds to the rectangular opening in the work surface, but slightly smaller lengthwise and width-wise for precise positioning within the opening during operation and use. A pair of spaced parallel lead screws are secured to the under side of the work surface on opposite sides of the opening through bearing members. The bearing members are secured to the under side of the work surface. A single lead screw extends transversely with respect to the pair of lead screws and is secured by bearing members to the under side of the work surface adjacent to the opening. A pair of threaded bearing members are secured to the under surface of the work plate. Each is threadably secured to one of the longitudinal lead screws for movement thereof and the work plate in the longitudinal direction. A pair of threaded bearing members are secured to the under surface of the work plate and threadedly secured along the transverse lead screw at spaced locations for the transverse movement of the work plate.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 7 is an enlarged front elevational view of the clamp mechanism assembly.

FIG. 8 is an enlarged view of the end clamp mechanism assembly and an adjacent work piece clamp.

FIG. 9 is an end view of the apparatus shown in FIG. 8 but with the work clamp piece in the angled position.

The same reference numerals refer to the same parts through the various Figures.

DESCRIPTION OF THE PREFERRED EMBODIMENT

Figure 1:
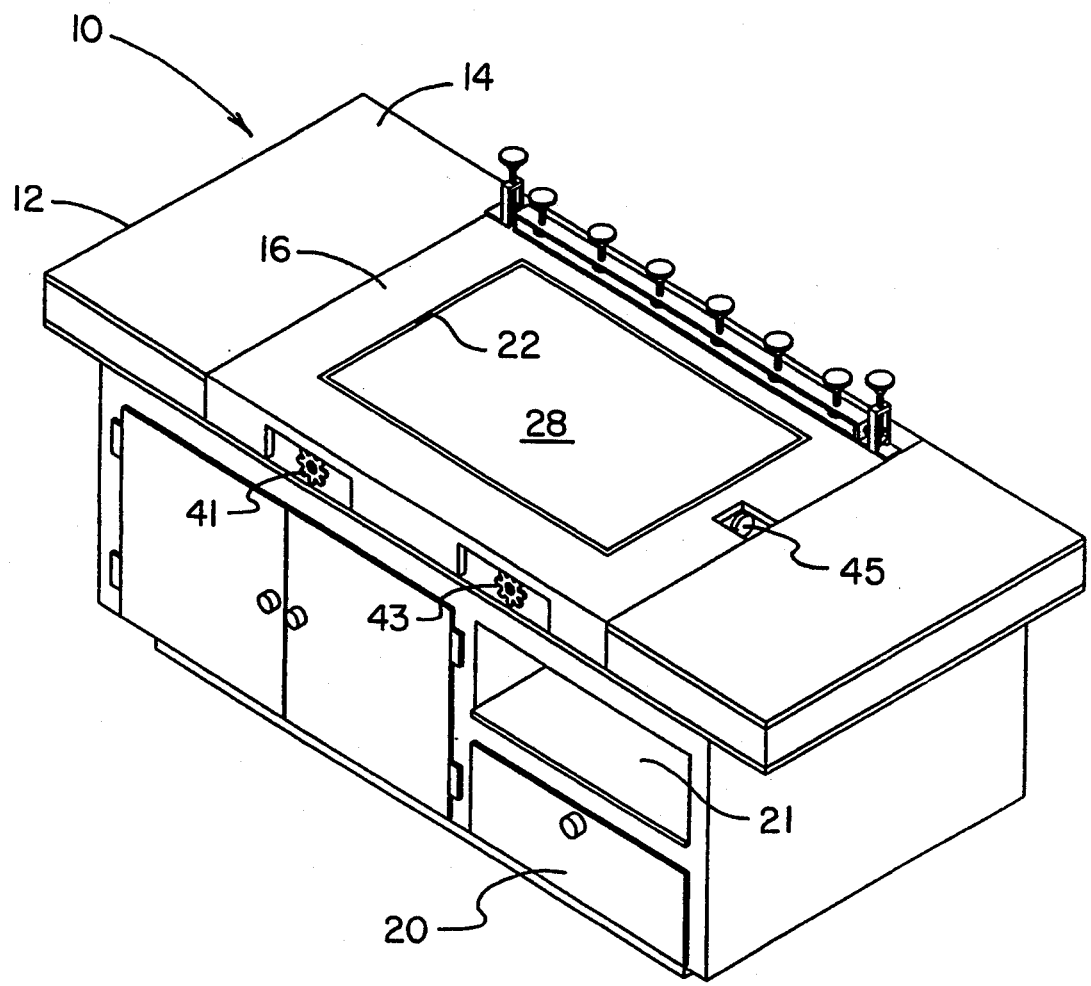
FIG. 1 is a perspective illustration of the preferred embodiment of the silk screen work stations and clamp mechanism assemblies for the precise positioning and support of the work pieces constructed in accordance with the principles of the present invention.
Figure 2:
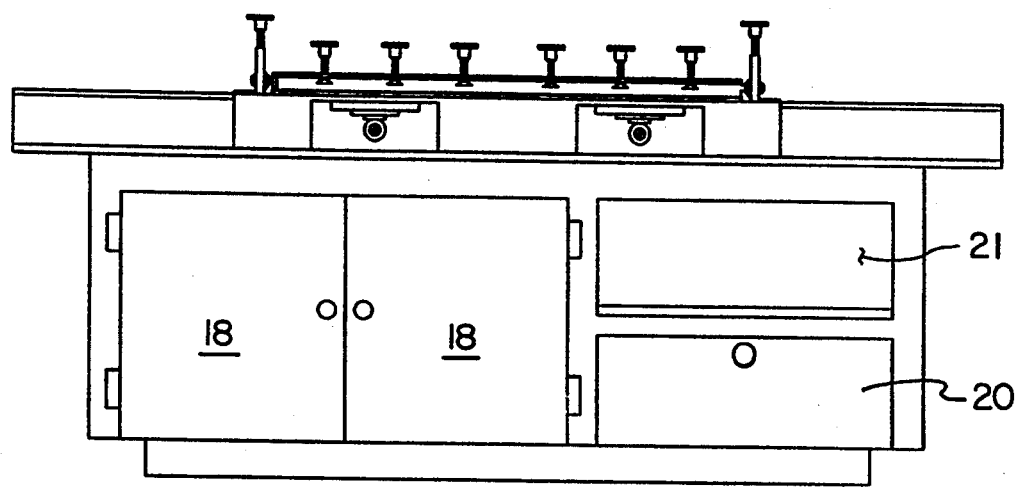
FIG. 2 is a front elevational view of the device shown in FIG. 1.
Figure 3:
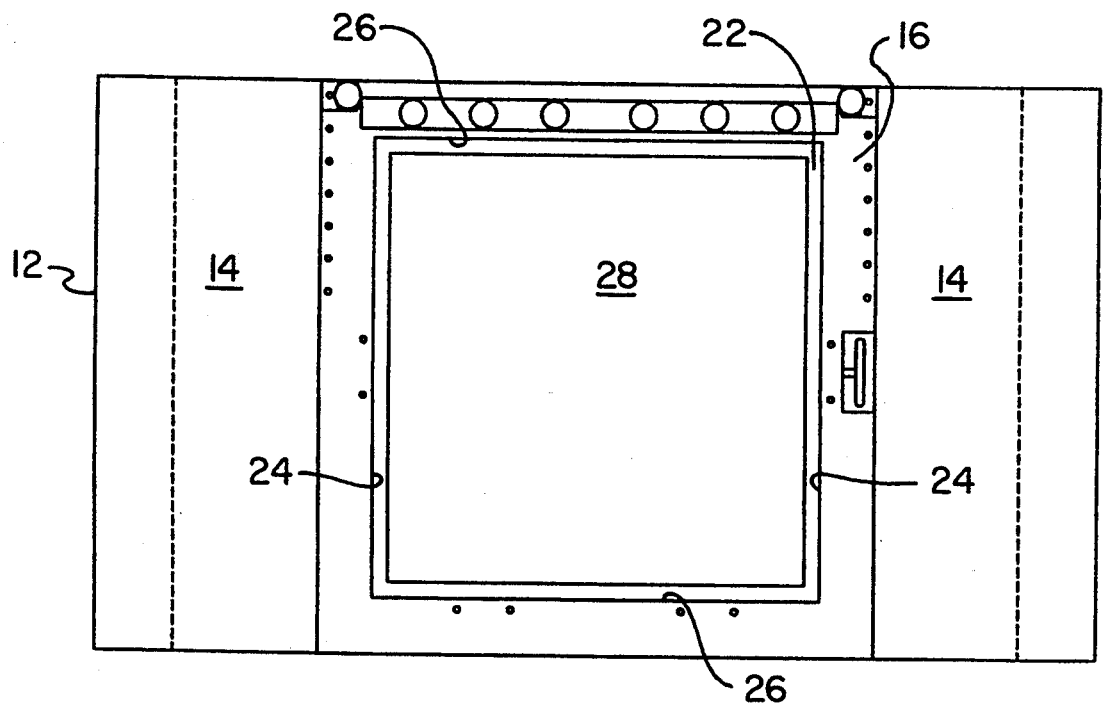
FIG. 3 is a top plan view of the device of the prior Figures.
Figure 4:
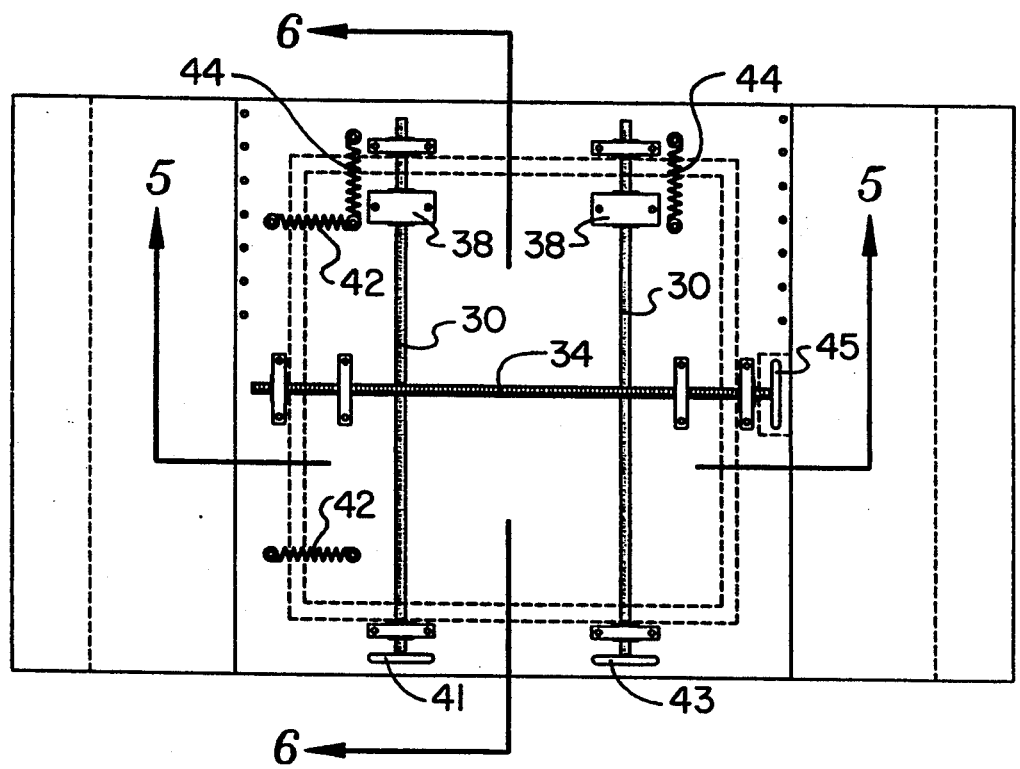
FIG. 4 is a bottom view of the device of the prior Figures showing the operating mechanisms.
Figure 5:
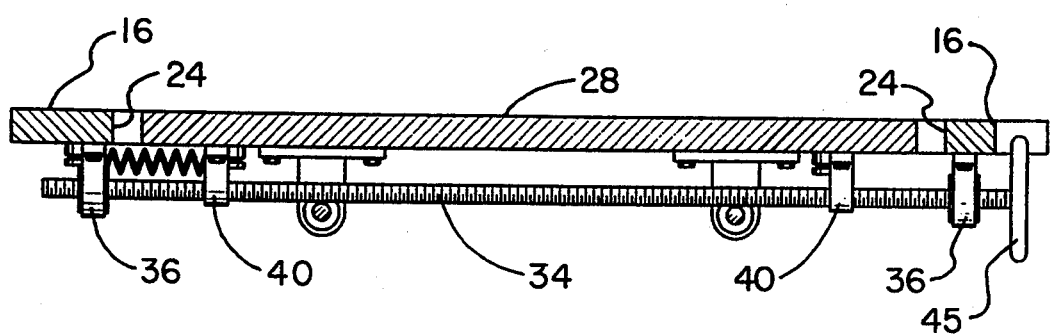
FIG. 5 is a cross sectional view taken along line 5—5 of FIG. 4.
Figure 6:
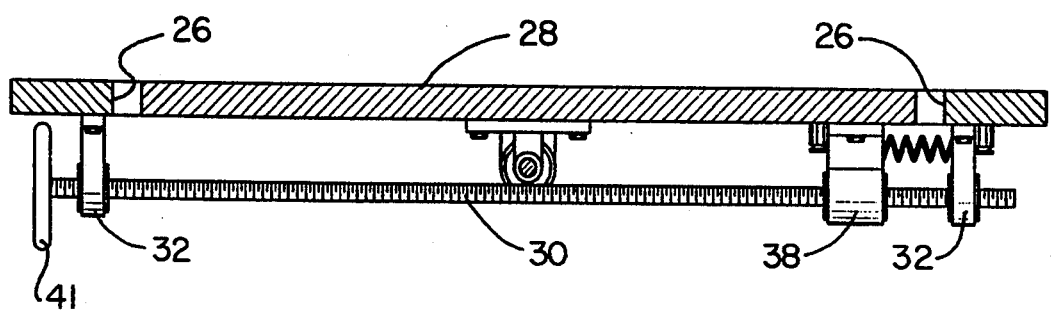
FIG. 6 is a cross section view taken along line 6—6 of FIG. 4.

With reference now to the drawings, and in particular to FIG. 1 thereof, the preferred embodiment of the silk screen work stations and clamp mechanism assemblies for the precise positioning and support of the work pieces embodying the principles and concepts of the present invention and generally designated by the reference numeral 10 will be described.

The present invention is directed to a new and improved silk screen work station and clamp mechanism assembly for the precise positioning and support of a work piece. In its broadest context, the invention may be considered as being formed of a cabinet, a work plate, a plurality of lead screws and bearing members associated therewith. The individual component parts of the system 10 are individually configured and adapted to cooperate one with the other to achieve their intended objectives.

More specifically, the invention includes a cabinet 12. The cabinet 12 has an upper planar work surface 14 with a centrally disposed working area 16. A pair of compartments 18 are located below the work area. Cabinet drawer 20 and a storage space 21 are also provided in the cabinet 12. The central working area also includes a lateral opening 22 formed therein. The opening has spaced parallel longitudinal edges 24 and spaced parallel lateral edges 26 therebetween.

Next provided in the system 10 is a work plate 28. The work plate is of a rectangular configuration and corresponds to the rectangular opening in the work surface 14. The work plate, however, is slightly smaller length wise and width wise than the opening. This reduction in size allows for shifting in the horizontal plane for its precise positioning within the opening during operation and use.

Movement of the work plate 28 with respect to the work surface 14 in the first meridian, longitudinally, is effected by a pair of spaced parallel lead screws 30. The lead screws are secured to the under side of the work surface 14 on opposite sides of the opening. Securement is through rotatable bearing members 32. The bearing members are secured to the underside of the work surface for supporting the lead screws.

For movement in the longitudinal direction, a single lead screw extends transversely to the parallel lead screws 30. The single lead screw 34, like the parallel lead screws, is secured by bearing members 36 to the under side of the work surface 14 at locations adjacent to the opening.

Secured to the under surface of the work plate 28 are a pair of threaded bearing members 38. The threaded bearing members are laterally spaced from each other and are each secured to one of the longitudinal lead screws. Rotation of the lead screws within the bearings thus effects the longitudinal movement of the work plate within the opening in the longitudinal direction.

A pair of threaded bearing members 40 are also secured to the under surface of the work plate 28. These bearing members are located laterally offset with respect to each other and are threadedly secured near opposite ends of the transverse lead screw. Such threaded bearing members are for effecting the transverse movement of the work plate within the opening upon rotation of the transverse lead screws. Exposed handles 41, 43 and 45 allow a user to rotate the lead screws for work plate positioning.

Greater precision of the work plate 28 is effected through a pair of lateral springs 42. Such springs are spaced from each other beneath the work surface 14 and the work plate. Such springs are secured at their opposite ends to the work surface and the work plate. They function to resiliently bias the work plate toward one longitudinal edge of the work surface.

Similarly, a pair of longitudinal springs 44 are spaced from each other and secured at one end to the under surface of the work plate 28 and at the other end to the work surface 14. The longitudinal springs also function to bias the work plate 28 but to an adjacent lateral edge of the opening.

Located across the top of the work surface 14 is a support bar 46. The support bar is provided with a plurality of threaded apertures located across the upper edge of the work surface. A plurality of threaded bolts 48 with suction cups 50 at their lower ends are also provided for releasable securement to the frame of the silk screen member. The suction cups allow for releasable securement thereof during operation and use. Movement of the suction cups 50 is effected by a pair of brackets 52 at opposite ends of the support bar 46. This allows for pivotable movement of the support bar, supported threaded screws as well as the suction cups adapted to hold the screen frame. Threaded bolts 54 outboardly of the support bar, allow for the locking of a circular rod 56 upon which the support bar is located. FIGS. 8 and 9 illustrate the suction cups 50 and support bar 44 in the operative position as well as the pivoted inoperative position.

Printed circuit board manufacture involves very close tolerances, and is often performed in a clean room environment to avoid contamination by dirt, dust, and other debris. One of the tasks in printed circuit board manufacturing is applying liquid solder circuits and/or lettering to a board using a silk screen process. Since the boards can be very large, the silk screen must be even larger, which makes placement and registration difficult.

The present invention is a special table for silk screen printing on printed circuit boards. In its preferred embodiment, it provides a clean, stable, easily adjustable frame for boards up to 36 square inches, a pivoting clamp assembly that can accommodate screens of up to 36 inches by 45 inches, and a number of storage compartments.

In its preferred embodiment as described, the present invention is 32.5 inches high with a table top that is 48 inches deep and 83 inches long. A central area 48 square inches contains a 36 square inch printed circuit board holder that can be adjusted in both X and Y directions. A storage compartment, 17.5 inches wide, whose top is hinged at the end of the table, is on either side of the central work area.

The top is attached to a work bench that is 72 inches long, 36 inches deep, and 28.5 inches high. Two 26 inch wide compartments, 8.5 inches high are on the right side. The upper compartment is open and the lower compartment has a hinged door. The left side is one large storage compartment with a pair of 18.5 by 20 inch center opening doors hinged at both sides.

A 48 square inch aluminum frame surrounds the 36 square inch printed circuit board holder. The holder has a polypropelene surface for easy cleanup. It can be moved about 0.5 inches forwardly and rearwardly in the Y or longitudinal direction, on both sides by two threaded rods that are controlled by removable knobs located at the front of the table. A third threaded rod in the center of the holder moves it from side to side about 0.5 inches in the X or lateral direction. It is turned by a knob that can be reached through an access opening on the right side of the aluminum frame.

The silk screen frames are firmly held on one side by six clamps in a clamping bar. The clamping bar is 36 inches long and rotates, thus inducing an up and down movement in the Z or vertical direction. It is made of three 36 inch long steel strips whose edges are bolted together in a U-shaped channel. The top piece is 2.5 inches wide and 0.5 inches thick, and is bolted to the top of the back piece, which is 3 inches wide and 0.5 inches thick. The bottom piece is 2.5 inches wide and 0.25 inches thick, and is bolted to the bottom of the back piece. The top piece has six 0.5 inch threaded holes 6 inches apart, 1 inch from the front. Each hole has a clamp in it. The clamps are made of a threaded rod 3 inches long with a 2 inch round pad on its bottom and a 3 inch knob on its top.

A 1 inch diameter steel rod 44 inches long is fastened 2.5 inches behind the back piece. Both ends of the rod are secured in a bearing that can slide up and down in an L-shaped mounting bracket. A threaded rod and knob, on the top of each mounting bracket, slides the bearings up and down to provide vertical adjustment. The mounting brackets are fastened to the sides of the aluminum frame at its top. Holes in both sides of the frame permit the clamp assembly to be fastened at different locations for different sized screens. These numerical values are by way of example only since various sizes could readily be utilized.

The present invention is used by first placing a printed circuit board on the holder and taping its edges down with masking tape. Then the top edge of a silk screen frame is placed in the clamping bar and temporarily secured. The frame is lowered and the clamp assembly is fastened to the aluminum frame at a position close to the required vertical position. The frame may then be loosened and moved close to its required vertical position, and fastened. The frame is adjusted vertically so the screen is flat over the entire circuit board, then the circuit board holder is adjusted to the correct registration. Liquid solder is then printed through the screen onto the board, the screen is rotated up, and the board is removed. If another board is to be printed, once it is fastened on the holder, it is only necessary to adjust the registration before it is printed.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A new and improved silk screen work station and clamp mechanism assembly for the precise positioning and support of a work piece comprising, in combination:

a cabinet having an upper planar work surface with a centrally disposed working area and a pair of compartments below the work area and with a cabinet drawer and storage space, the central working area also having a rectangular opening formed therein, the opening having lateral and longitudinal edges;

a work plate in a rectangular configuration corresponding to the rectangular opening in the work surface, but slightly smaller lengthwise and widthwise for precise positioning within the opening during operation and use;

a pair of spaced parallel lead screws secured to an under side of the work surface on opposite sides of the opening through bearing members, the bearing members being secured to the under side of the work surface;

a single lead screw extending transversely with respect to the pair of lead screws and secured by bearing members to the under side of the work surface adjacent to the opening;

a pair of threaded bearing members secured to an under surface of the work plate, each threadably secured to one of the parallel lead screws for movement thereof and the work plate in the longitudinal direction;

a pair of threaded bearing members secured to the under surface of the work plate and threadedly secured along the transverse lead screw at spaced locations for the transverse movement of the work plate;

a pair of lateral springs spaced from each other beneath the work surface and the work plate secured at their opposite ends to the work surface and work plate for resiliently biasing the work plate toward one lateral edge of the work surface;

a pair of longitudinal springs spaced from each other and secured at one end to the under surface of the work plate and at the other end to the work surface for biasing the work plate to an adjacent longitudinal edge thereof; and a support bar with a plurality of threaded apertures located across the upper edge of the work surface, with a plurality of threaded bolts with suction cups at their lower ends for releasable securement to the screen frame, and a pair of brackets at opposite ends of the support bar for effecting pivotable movement of the support bar, the supported threaded bolts and the suction cups.

2. A silk screen work station and clamp mechanism assembly for the precise positioning and support of a work piece comprising:

a cabinet having an upper planar work surface with a centrally disposed working area and a pair of compartments below the work area and with a cabinet drawer and storage space, the central working area also having a rectangular opening formed therein, the opening having lateral and longitudinal edges;

a work plate in a rectangular configuration corresponding to the rectangular opening in the work surface, but slightly smaller lengthwise and widthwise for precise positioning within the opening during operation and use;

a pair of spaced parallel lead screws secured to an under side of the work surface on opposite sides of the opening through bearing members, the bearing members being secured to the under side of the work surface;

a single lead screw extending transversely with respect to the pair of lead screws and secured by bearing members to the under side of the work surface adjacent to the opening;

a pair of threaded bearing members secured to an under surface of the work plate, each threadably secured to one of the parallel lead screws for movement thereof and the work plate in the longitudinal direction; and a pair of threaded bearing members secured to the under surface of the work plate and threadedly secured along the transverse lead screw at spaced locations for the transverse movement of the work plate.

3. The device as set forth in claim 2 and further including:

a pair of lateral springs beneath the work surface and the work plate secured at their opposite ends to the work surface and work plate for biasing the work plate toward one lateral edge of the work surface; and a pair of transverse springs parallel and spaced from each other and secured at one end to the under surface of the work plate for biasing the work plate to an adjacent edge thereof.

4. The device as set forth in claim 2 and further including:

a bar with a plurality of threaded apertures located across an upper edge of the work surface, with a plurality of threaded bolts with suction cups at their lower ends for releasable securement to the screen frame, and a pair of brackets at opposite ends of the support bar for effecting pivotable movement of the support bar and the supported threaded bolts and suction cups.

* * * * *